(12) United States Patent
Lu et al.

(10) Patent No.: US 11,374,198 B2
(45) Date of Patent: Jun. 28, 2022

(54) MANUFACTURING METHOD OF FLEXIBLE DISPLAY PANEL COMPRISING FORMING DAM GROUP DISPOSED AROUND EDGE OF LIGHT EMITTING DEVICE LAYER

(71) Applicant: Wuhan China Star Optoelectronics Semiconductor Display Technology Co., Ltd., Hubei (CN)

(72) Inventors: Rui Lu, Hubei (CN); Xuebing Yin, Hubei (CN)

(73) Assignee: Wuhan China Star Optoelectronics Semiconductor Display Technology Co., Ltd., Hubei (CN)

( * ) Notice: Subject to any disclaimer, the term of this patent is extended or adjusted under 35 U.S.C. 154(b) by 0 days.

(21) Appl. No.: 16/641,154

(22) PCT Filed: Nov. 19, 2019

(86) PCT No.: PCT/CN2019/119538
§ 371 (c)(1),
(2) Date: Feb. 21, 2020

(87) PCT Pub. No.: WO2021/027171
PCT Pub. Date: Feb. 18, 2021

(65) Prior Publication Data
US 2021/0408460 A1 Dec. 30, 2021

(30) Foreign Application Priority Data
Aug. 14, 2019 (CN) .......................... 201910747074.4

(51) Int. Cl.
*H01L 51/52* (2006.01)
*H01L 27/32* (2006.01)
*H01L 51/56* (2006.01)

(52) U.S. Cl.
CPC ...... *H01L 51/5253* (2013.01); *H01L 27/3246* (2013.01); *H01L 51/5206* (2013.01);
(Continued)

(58) Field of Classification Search
CPC ............. H01L 27/3246; H01L 51/5206; H01L 51/5253; H01L 51/56; H01L 2251/308; H01L 2251/5338
(Continued)

(56) References Cited

U.S. PATENT DOCUMENTS

2016/0247862 A1 8/2016 Song et al.
2021/0225992 A1* 7/2021 Long .................. H01L 51/5253

FOREIGN PATENT DOCUMENTS

CN 104167430 A 11/2014
CN 106816456 A 6/2017
(Continued)

*Primary Examiner* — Hoai V Pham
(74) *Attorney, Agent, or Firm* — Taft Stettinius & Hollister LLP

(57) ABSTRACT

A flexible display panel and a manufacturing method thereof are provided. By filling a protective film in a stress concentration area of an inorganic film layer at a corner of a dam, a slope of a side wall of the dam can be effectively reduced, and stress concentration effect of the inorganic film layer in an upper packaging structure is reduced to a certain extent. When the protective film is subjected to stress, it can effectively relieve the stress and weaken or even eliminate stress effect of the packaging structure on an anode layer at a corner of the dam.

7 Claims, 4 Drawing Sheets

(52) U.S. Cl.
CPC ........ *H01L 51/56* (2013.01); *H01L 2251/308* (2013.01); *H01L 2251/5338* (2013.01)

(58) Field of Classification Search
USPC .......................................................... 257/40
See application file for complete search history.

(56) References Cited

FOREIGN PATENT DOCUMENTS

| | | |
|---|---|---|
| CN | 106981584 A | 7/2017 |
| CN | 107293554 A | 10/2017 |
| CN | 108832017 A | 11/2018 |
| CN | 109920937 A | 6/2019 |
| KR | 20160050422 A | 5/2016 |

\* cited by examiner

MANUFACTURING METHOD OF FLEXIBLE
DISPLAY PANEL COMPRISING FORMING
DAM GROUP DISPOSED AROUND EDGE OF
LIGHT EMITTING DEVICE LAYER

CROSS REFERENCE TO RELATED APPLICATIONS

This application claims priority to, and the benefit of, International Application No. PCT/CN2019/119538, filed on Nov. 19, 2019, which claims priority to, and the benefit of, Chinese Application No. 201910747074.4, filed on Aug. 14, 2019. The entire disclosures of each of the above applications are incorporated herein by reference.

FIELD OF INVENTION

The present disclosure relates to the field of display technologies, and more particularly to a flexible display panel and a manufacturing method thereof.

BACKGROUND OF INVENTION

With the rapid development of organic light emitting diode (OLED) display technology, curved surface and flexible display products are rapidly entering the market, and technological updates in related fields are also changing with each passing day. OLED devices are diode devices that use organic light emitting materials to drive light through carrier injection and recombination under drive of an electric field. OLED devices have attracted widespread attention due to their advantages such as light weight, thin thickness, flexibility, and wide viewing angle ranges.

Since a light emitting material of the OLED device is very sensitive to water and oxygen, a small amount of water and oxygen invasion will cause rapid attenuation and aging of the device, thereby affecting its life. Effectively block destruction of OLED devices by external water and oxygen to ensure a long service life of OLED flexible display panels, and its packaging technology is particularly important.

Existing thin film encapsulation (TFE) designs generally use a stack structure of an inorganic film layer/organic film layer to achieve the purpose of blocking water and oxygen. The main function of the inorganic film layer is to block water and oxygen. Generally, the inorganic film layer is prepared by a chemical vapor deposition (CVD) process or an atomic layer deposition (ALD) process. The organic film layer mainly plays a role of flattening a surface of a substrate, covering contaminated particles, and slowing down stress. It is generally prepared by an inkjet printing (IJP) process or an atomic layer deposition process. In order to prevent the organic film layer from flowing out of a covered area of the inorganic film layer, one or more dams are generally designed around a display area (such as active area, AA) of a display panel.

Technical Problem

Referring to FIG. 1, a sectional view of a layered structure of a conventional OLED display panel is provided. The OLED display panel includes a thin film transistor (TFT) array substrate 11, a light emitting device layer 12 formed on the TFT array substrate 11, a dam 13 disposed around an edge of the light emitting device layer 12, and a packaging structure 14 disposed on the light emitting device layer 12.

The TFT array substrate 11 includes a TFT array layer 111 and a planarization layer (PLN) 112 formed on the TFT array layer 111. The TFT array layer 111 is a driving circuit of an OLED panel and is an important part of a display panel. The planarization layer 112 mainly plays a role of flattening an in-plane segment difference caused by patterns of various layers on the TFT array substrate 11, isolating TFTs from the light emitting device layer and preventing electric field interference.

The light emitting device layer 12 includes an anode (ANO) layer 121, a pixel definition (PDL) layer 122, a light emitting material layer 123, and a cathode layer (not shown), which are stacked in this order. The anode layer 121 has a sandwich structure of a first indium tin oxide (ITO) layer 1211, an Ag layer 1212, and a second ITO layer 1213. The light emitting material functional layer 123 is formed in a region defined by the pixel definition layer 122.

The dam 13 is used to prevent organic film material in the packaging structure 14 from flowing out of a coverage area of an inorganic film layer.

The packaging structure 14 includes a first inorganic film layer 141 covering the dam 13, the light emitting device layer 12, and the TFT array substrate 11, a first organic film layer 142 deposited on the first inorganic film layer 141, and a second inorganic film layer 143 covering the first organic film layer 142 and the first inorganic film layer 141.

Referring to FIG. 2, a schematic diagram of a peeling phenomenon of an anode layer of a conventional OLED display panel is provided. An arrow on the anode layer 121 in the figure indicates a stress direction. In an actual packaging reliability test of the OLED display panel, it is found that after the packaging structure 14 is packaged, the second ITO layer 1213 and the Ag layer 1212 of the anode layer 121 are prone to peel 201 at a corner of the dam. That is to say, the anode layer 121 at the corner of the dam itself will be peeled off, which will cause the package to fail. The reasons for analysis are as follows:

1) Stress concentration effect of the inorganic film layer: because the dam is used to prevent the organic film layer from overflowing, a height thereof is generally high. The packaging film layer at the dam has only an inorganic film layer and has no stress-relieving effect. This results in greater stress at the corners of the dam. The larger stress will pick up the upper ITO layer, which will cause the upper ITO layer and the Ag layer to peel off, resulting in a peeling phenomenon. This is also the main factor for the peeling of the anode layer.

2) Bonding force between the ITO layer and the Ag layer is weak: the anode layer is a metal film layer, and physical vapor deposition (PVD), pulsed laser deposition (PLD), and other equipment are generally used for physical deposition. This results in a weaker bonding force between film layers. When subjected to stress of the inorganic film layer in the packaging structure, it is easy to peel off at a weak bonding force, and peeling phenomenon occurs.

SUMMARY OF INVENTION

An object of the present application is to provide a flexible display panel and a manufacturing method thereof, which can solve issues existing in the prior art, relieve stress concentration effect of an inorganic film layer at a corner of a dam, thereby effectively improving peeling of an anode layer of the flexible display panel and improving package yield of a display panel.

In order to achieve the above object, an embodiment of the present application provides a flexible display panel, comprising an array substrate; a light emitting device layer comprising an anode layer formed on the array substrate, wherein the anode layer has a sandwich structure of a first indium tin oxide (ITO) layer, an Ag layer, and a second ITO layer; a dam group comprising at least one dam arranged around an edge of the light emitting device layer; a protective film covering at least a part of at least one side wall of the at least one dam, wherein a slope of a side wall of the protective film away from the at least one dam is less than a slope of a side wall of the at least one dam; and a packaging structure formed on the light emitting device layer and completely covering the light emitting device layer, the at least one dam, the protective film, and the array substrate.

In order to achieve the above object, an embodiment of the present application further provides a flexible display panel, comprising: an array substrate; a light emitting device layer comprising an anode layer formed on the array substrate; a dam group comprising at least one dam arranged around an edge of the light emitting device layer; a protective film covering at least a part of at least one side wall of the at least one dam; and a packaging structure formed on the light emitting device layer and completely covering the light emitting device layer, the at least one dam, the protective film, and the array substrate.

In order to achieve the above object, an embodiment of the present application further provides a manufacturing method of a flexible display panel, comprising following steps: forming an anode layer of a light emitting device layer on an array substrate; forming a dam group and a pixel definition layer of the light emitting device layer on the anode layer, wherein the dam group comprises at least one dam disposed around an edge of the light emitting device layer; forming a protective film near the at least one dam, the protective film covering at least a part of at least one side wall of the at least one dam; forming a light emitting material functional layer of the light emitting device layer in a region defined by the pixel definition layer; and forming a packaging structure on the light emitting device layer, and the packaging structure completely covering the light emitting device layer, the at least one dam, the protective film, and the array substrate.

Beneficial Effect

An embodiment of the present application fills the protective film in a stress concentration area of the inorganic film layer at the corner of the dam. On one hand, it can effectively slow down the slope of the sidewall of the dam and reduce stress concentration effect of the inorganic film layer in the upper packaging structure to a certain extent. On the other hand, when the protective film is subjected to stress, it can effectively relieve the stress and weaken or even eliminate stress effect of the packaging structure on the anode layer at the corner of the dam. By slowing down stress concentration at the corner of the dam from the above two aspects, issues of easy peeling of the anode layer at the dam can be effectively improved, and packaging yield of the flexible display panel can be improved.

DESCRIPTION OF DRAWINGS

In order to explain technical solutions in embodiments of the present application more clearly, drawings used in the description of the embodiments will be briefly introduced below. Obviously, the drawings in the following description are only some embodiments of the present application. For those skilled in the art, other drawings can be obtained based on these drawings without paying any creative efforts.

DETAILED DESCRIPTION OF PREFERRED EMBODIMENTS

Figure 1:
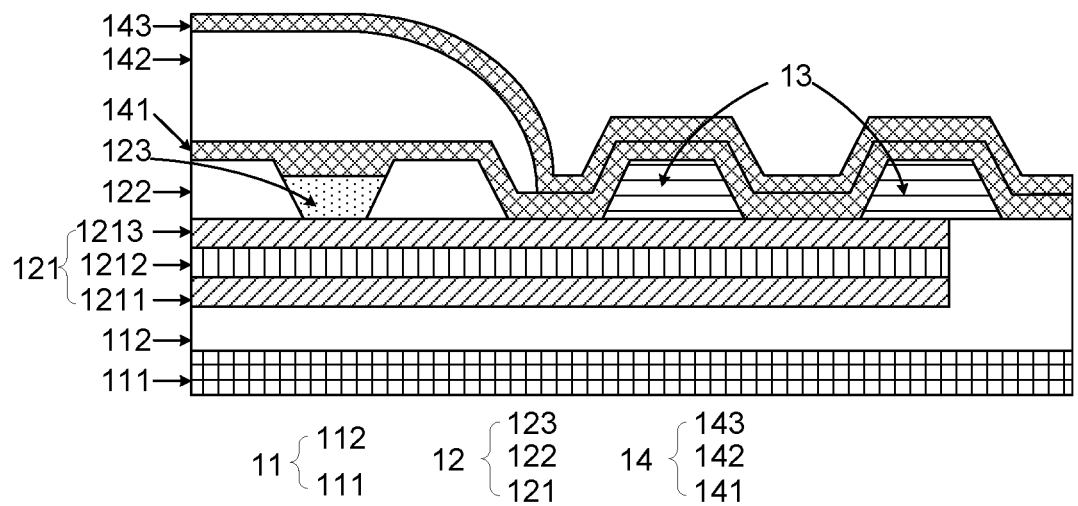
FIG. 1 is a sectional view of a layered structure of a conventional OLED display panel.
Figure 2:
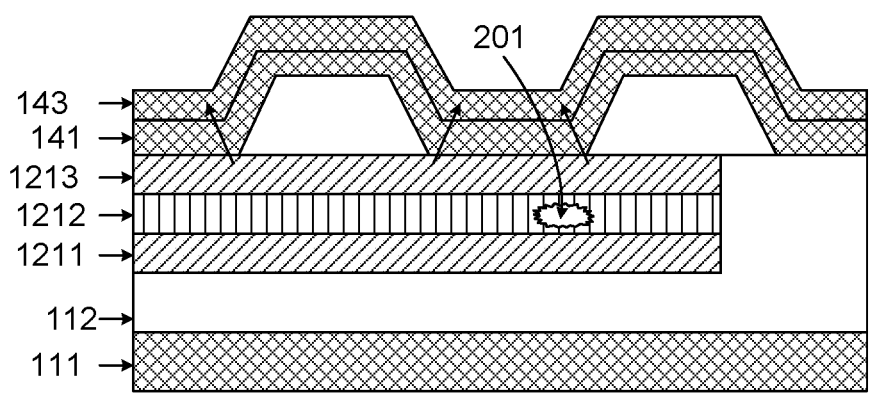
FIG. 2 is a schematic diagram showing peeling of an anode layer of a conventional OLED display panel.

The embodiments of the present application are described in detail below, and examples of the embodiments are shown in the drawings, wherein the same or similar reference numerals indicate the same or similar elements or elements having the same or similar functions throughout. The embodiments described below with reference to the drawings are exemplary and are only used to explain the present application and should not be construed as limiting the present application.

The terms "first", "second", "third", etc. (if present) in the description and claims of the present application and the accompanying drawings are used to distinguish similar objects and are not necessarily used to describe a specific order or sequence. It should be understood that, the objects so described are interchangeable under appropriate circumstances. In this application, unless explicitly stated and limited otherwise, the first feature "above" or "below" the second feature may include direct contact between the first and second features, or it may include that the first and second features are not in direct contact but are contacted through another feature between them. Moreover, the first feature is "above", "over", and "on" the second feature, including that the first feature is directly above and obliquely above the second feature, or merely indicates that the first feature is higher in level than the second feature. The first feature is "below", "under", and "underneath" of the second feature, including that the first feature is directly below and obliquely below the second feature, or merely indicates that the first feature is less in level than the second feature.

The following disclosure provides many different implementations or examples for implementing different structures of the present application. To simplify the disclosure of this application, the components and settings of specific examples are described below. Of course, they are merely examples and are not intended to limit the application. In addition, the present application may repeat reference numbers and/or reference letters in different examples. This repetition is for the purpose of simplicity and clarity and does not in itself indicate the relationship between the various embodiments and/or settings discussed. In addition, this application provides examples of various specific processes and materials, but those of ordinary skill in the art may be aware of the application of other processes and/or the use of other materials.

A flexible display panel of an embodiment of the present application includes an array substrate, a light emitting device layer formed on the array substrate, at least one dam disposed around an edge of the light emitting device layer, a protective film covering at least a part of at least one side wall of the dam, and a packaging structure formed on the light emitting device layer. The packaging structure adopts an inorganic/organic film layer stack structure. The protective film is prepared by using an exposure development method, a mask plate technology, or an embossing method at a corner of the dam, on one hand, it can effectively slow down a slope of the dam and reduce stress concentration effect of an inorganic film layer in the packaging structure to a certain extent. On the other hand, the protective film is enough to relieve stress of the inorganic film layer, so that the inorganic film layer no longer acts on an anode layer of the light emitting device layer, thereby protecting the anode layer, thereby effectively improving the dam. This effectively improves peeling of the anode layer at the dam and improves packaging yield of the flexible display panel.

Figure 3:
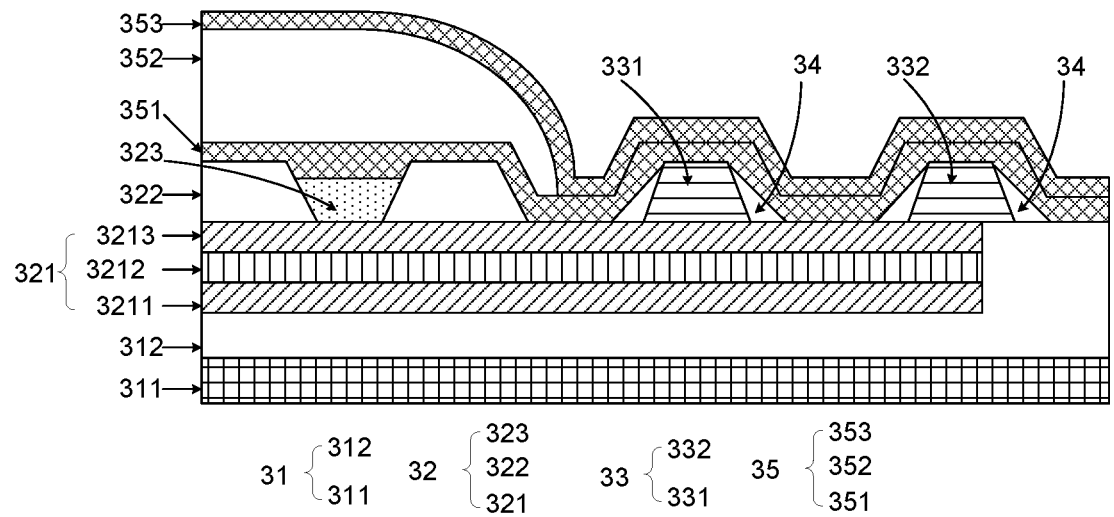
FIG. 3 is a cross-sectional view of a part of a layered structure of a first embodiment of a flexible display panel of the present application.

Referring to FIG. 3, which is a cross-sectional view of a part of a layered structure of a first embodiment of a flexible display panel of the present application. The flexible display panel includes an array substrate 31, a light emitting device layer 32, a dam group 33, a protective film 34, and a packaging structure 35.

In an embodiment, the array substrate 31 is a thin film transistor (TFT) array substrate and includes a TFT array layer 311 and a planarization layer (PLN) 312 formed on the TFT array layer 311. The TFT array layer 311 is a driving circuit of the flexible display panel and is an important component of the display panel. The planarization layer 312 mainly plays a role of flattening in-plane segment difference caused by patterns of various layers on the TFT array substrate 31, isolating TFTs from the light emitting device layer 32, and preventing electric field interference. For a manufacturing process of the array substrate 31, reference may be made to an existing process, which is not limited in the present application.

In an embodiment, the light emitting device layer 32 includes an anode layer 321, a pixel definition layer (PDL) 322, a light emitting material functional layer 323, and a cathode layer (not shown), which are sequentially stacked.

The anode layer 321 adopts a sandwich structure of a first ITO layer 3211, an Ag layer 3212, and a second ITO layer 3213. ITO has a high light transmittance and has effects of improving adhesion of film layers, improving work function, and improving matching degree of light emitting material in the light emitting material layer 123. Ag has high electrical conductivity and high emissivity, which can effectively prevent light transmission. Because the anode layer 321 is a metal film layer, physical vapor deposition (PVD), pulsed laser deposition (PLD), and other equipment are generally used for physical deposition. This results in a weaker bonding force between film layers. In an embodiment, an edge of the anode layer 321 in a sandwich structure is covered by the planarization layer 312.

The light emitting material functional layer 323 includes an electron injection layer (EIL), an electron transport layer (ETL), a light emitting layer (EML), a hole injection layer (HIL), and a hole transport layer (HTL), which are formed on an area defined by the pixel definition layer 322. Light emitting material of the light emitting material functional layer 323 may be an OLED light emitting material. Accordingly, the flexible display panel is an OLED flexible display panel. It should be noted that, in other embodiments, the light emitting material of the light emitting material functional layer 323 may also be a quantum dot light emitting material, and a specific setting form of the light emitting material is not limited in the present application.

In an embodiment, the dam group 33 includes a first dam 331 and a second dam 332 spaced around an edge of the light emitting device layer 32 to prevent organic film material in the packaging structure from flowing out of a covered area of the inorganic film layer. Specifically, the first dam 331 is disposed on the anode layer 321 and is close to the pixel definition layer 322. The second dam 332 is disposed on an interface between the anode layer 321 and the planarization layer 312 and is away from the pixel definition layer 322. Shapes of the first dam 331 and the second dam 332 are the same. In other embodiments, the shapes of the two dams may be different. The dam group 33 is an organic film layer, which can be the same layer as the pixel definition layer 322 and is prepared by using the same patterning process. The dam of the dam group 33 may be made of polyparaxyl or parylene materials, and the same mask as the pixel definition layer 322 is prepared through processes such as exposure and development. to make. It should be noted that a number of the dams of the dam group 33 is not limited to one, and may be two or more, which is not limited in the present application.

In an embodiment, the protective films 34 cover two side walls of the first dam 331 and two side walls of the second dam 332, respectively. That is, the protective film is filled in a stress concentration area of the inorganic film layer at a corner of the corresponding dam. This can relieve stress concentration effect, thereby improving an issue of peeling phenomenon at the anode layer in the flexible display panel.

In a further embodiment, the protective film 34 can be prepared by an exposure and development method, a mask technology, or an imprint method. Material of the protective film 34 may be epoxy resin, aluminum-based organic-inorganic composite film (alucone), or hexamethyldisiloxane (HMDSO).

In a further embodiment, a thickness of the protective film 34 is less than or equal to a thickness of the first dam 331 (the second dam 332 has the same shape as the first dam 331). In a front view, a cross-sectional view of the protective film 34 is an obtuse triangle, and a side wall of the protective film 34 away from the first dam 331 is a longest side of the obtuse triangle. A slope of a side wall of the protective film 34 away from the first dam 331 (that is, a side wall corresponding to a longest side of the obtuse triangle) is less than a slope of a sidewall of the first dam 331.

In an embodiment, the packaging structure 35 is formed on the light emitting device layer 32 and completely covers the light emitting device layer 32, the dam group 33, the protective film 34. and the array substrate 31.

In a further embodiment, the packaging structure 35 adopts an inorganic/organic film layer stack structure, which includes a first inorganic film layer 351, a first organic film layer 352, and a second inorganic film layer 353. It should be noted that the packaging structure 35 may also include a plurality of organic film layers. The plurality of organic film layers may be stacked between the first inorganic film layer 351 and the second inorganic film layer 353.

The first inorganic film layer 351 completely covers the light emitting device layer 32, the dam group 33, the protective film 34, and the array substrate 31. Its main function is to isolate water and oxygen and this prevents water or oxygen from invading the light emitting device layer (especially the light emitting material functional layer 323) and causing light emission to become dark. The first inorganic film layer 351 may be formed by using a chemical vapor deposition (CVD) process, a plasma enhanced chemical vapor deposition (PECVD) process, an atomic layer deposition (ALD) process, a physical vapor deposition (PVD) process, or sputtering coating process. It can be understood that the material used for the first inorganic film layer 351 is an inorganic material capable of increasing water and oxygen blocking performance of the device.

The first organic film layer 352 is deposited on the first inorganic film layer 351 and is located on a side of the dam group 33 away from an edge of the flexible display panel. It mainly plays a role of flattening a surface of the substrate and covering contaminated particles. The first organic film layer 352 may be prepared by using an inkjet printing (IJP) process. It can be understood that the material used for the first organic film layer 352 is a material for buffering stress of the device during bending and folding and covering the particulate pollutants. It can be understood that in some embodiments, there may be no contaminating particles.

The second inorganic film layer 353 completely covers the first organic film layer 352 and the first inorganic film layer 351, and its main function is to block water and oxygen. The second inorganic film layer 353 can also be prepared by using a chemical vapor deposition process, a plasma enhanced chemical vapor deposition process, an atomic layer deposition process, a physical vapor deposition process, or a sputtering coating process. It can be understood that the material used for the second inorganic film layer 353 is also an inorganic material that can increase the water and oxygen blocking performance of the device, which may be the same as the material used for the first inorganic film layer 351.

According to an analysis of peeling phenomenon at the anode layer in the flexible display panel, it can be understood that stress concentration of the inorganic film layer at the corner of the dam is a main factor for the peeling phenomenon at the anode layer. An embodiment of the present application fills the protective film in a stress concentration area of the inorganic film layer at the corner of the dam. On one hand, it can effectively slow down the slope of the side wall of the dam and reduce the stress concentration effect of the inorganic film layer in the upper packaging structure to a certain extent. On the other hand, when the protective film is subjected to stress, it can effectively relieve the stress and weaken or even eliminate the stress effect of the packaging structure on the anode layer at the corner of the dam. By slowing down the stress concentration at the corner of the dam from the above two aspects, an issue of easy peeling of the anode layer at the dam can be effectively improved, and packaging yield of the flexible display panel can be improved.

Figure 4:
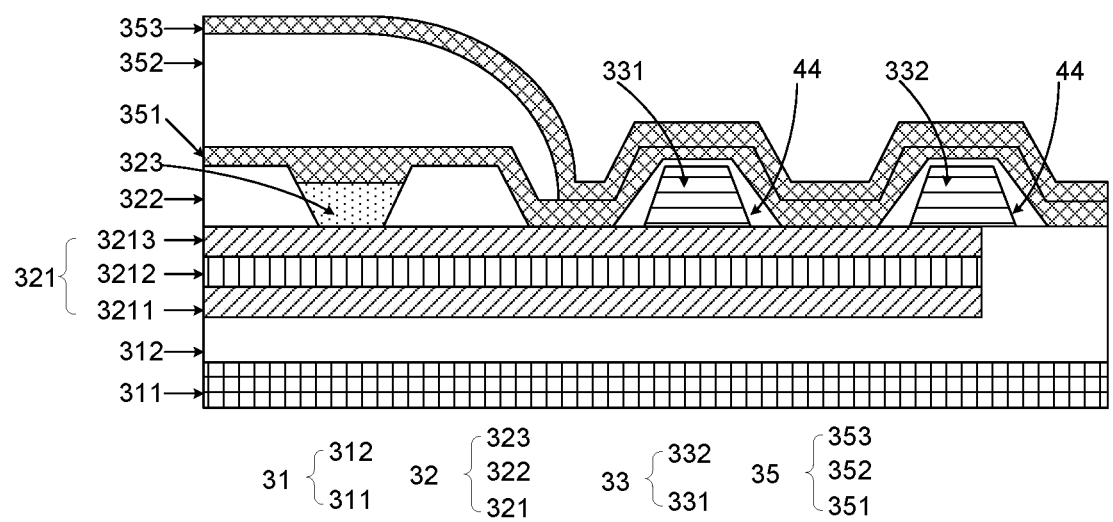
FIG. 4 is a cross-sectional view of a part of a layered structure of a second embodiment of a flexible display panel of the present application.

Referring to FIG. 4, a cross-sectional view of a part of a layered structure of a second embodiment of a flexible display panel according to the present application is provided. The difference from the embodiment shown in FIG. 3 is that, in this embodiment, a protective film 44 completely covers the dam group 33. Specifically, the protective film 44 covers both side walls and a top surface of the first dam 331 and covers both side walls and a top surface of the second dam 332. A thickness of the protective film 44 covering the top surface of the corresponding dam is designed to be about 1 µm. That is, all exposed surfaces of the corresponding dam are covered with a protective film. This design can not only relieve stress concentration at the corner of the corresponding dam, but also relieve the stress at the top surface of the corner of the dam. This is more conducive to slowing down the stress effect of the inorganic film layer in the packaging structure, and effectively improving the issue of the peeling phenomenon at the anode layer in the flexible display panel. Similarly, a slope of a side wall of the protective film 44 away from the first dam 331 is less than a slope of a side wall of the first dam 331.

Figure 5:
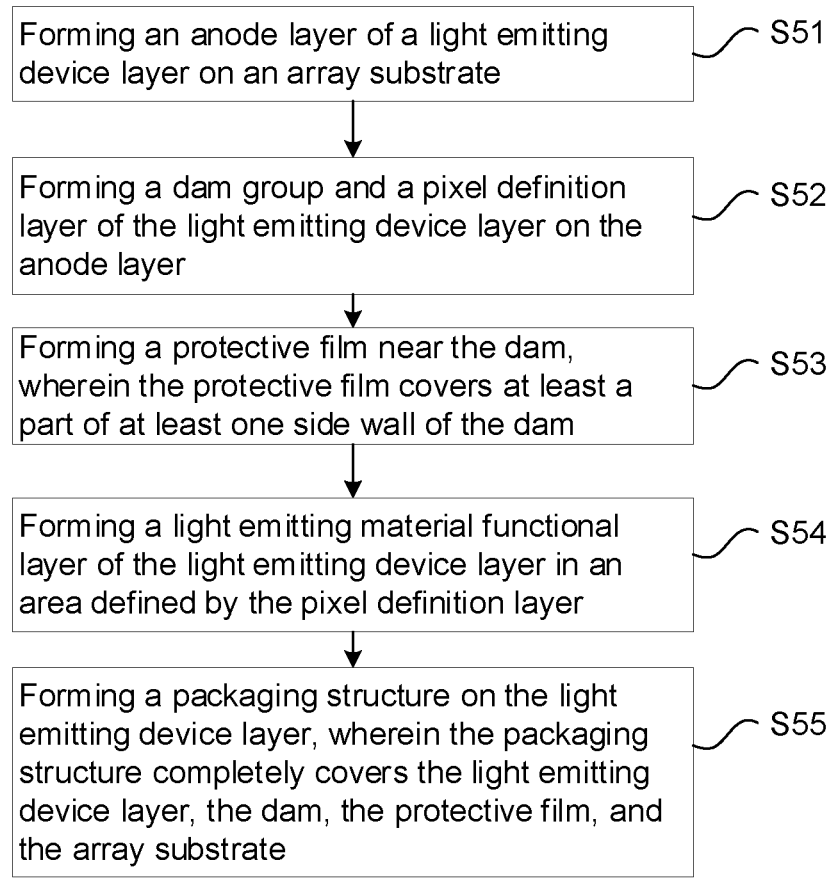
FIG. 5 is a schematic flowchart of a manufacturing method of a flexible display panel of the present application.

Based on the same application concept, the present application also provides a manufacturing method of a flexible display panel. Referring to FIG. 5 and FIG. 6A to FIG. 6D together, wherein FIG. 5 is a schematic flowchart of a manufacturing method of a flexible display panel of the present application, and FIG. 6A to FIG. 6D are flowcharts of manufacturing a flexible display panel according to an embodiment of the present application.

A manufacturing method of a flexible display panel of an embodiment of the present application specifically includes the following steps.

Figure 6A:
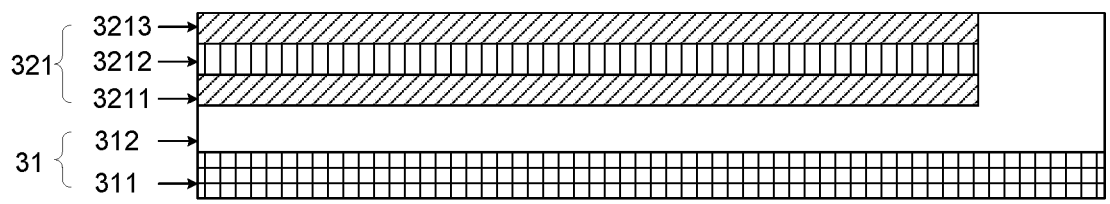
FIG. 6A to FIG. 6D are manufacturing flowcharts of an embodiment of a flexible display panel of the present application.

Step S51, forming an anode layer of a light emitting device layer on an array substrate; the structure obtained by this step is shown in FIG. 6A. In an embodiment, the array substrate 31 is a thin film transistor (TFT) array substrate and includes a TFT array layer 311 and a planarization layer (PLN) 312 formed on the TFT array layer 311. The TFT array layer 311 is a driving circuit of the flexible display panel and is an important component of the display panel. The planarization layer 312 mainly plays a role of flattening in-plane segment difference caused by patterns of various layers on the TFT array substrate 31, isolating TFTs from the light emitting device layer 32, and preventing electric field interference. For a manufacturing process of the array substrate 31, reference may be made to an existing process, which is not limited in the present application. The anode layer 321 adopts a sandwich structure of a first ITO layer 3211, an Ag layer 3212, and a second ITO layer 3213. ITO has a high light transmittance and has effects of improving adhesion of film layers, improving work function, and improving matching degree of light emitting material in the light emitting material layer 123. Ag has high electrical conductivity and high emissivity, which can effectively prevent light transmission. In an embodiment, an edge of the anode layer 321 in a sandwich structure is covered by the planarization layer 312.

Figure 6B:
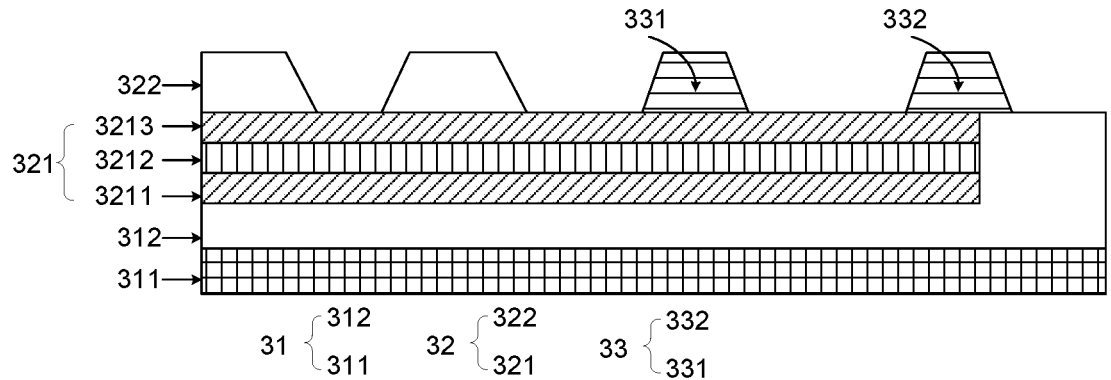

Step S52, forming a dam group and a pixel definition layer of the light emitting device layer on the anode layer, wherein the dam group includes at least one dam disposed around an edge of the light emitting device layer; The structure obtained in this step is shown in FIG. 6B. The dam group 33 may be the same layer as the pixel definition layer 322 and is prepared by using the same patterning process.

In an embodiment, the dam group 33 includes a first dam 331 and a second dam 332 spaced around an edge of the light emitting device layer 32 to prevent organic film material in the packaging structure from flowing out of a covered area of the inorganic film layer. Specifically, the first dam 331 is disposed on the anode layer 321 and is close to the pixel definition layer 322. The second dam 332 is disposed on an interface between the anode layer 321 and the planarization layer 312 and is away from the pixel definition layer 322. Shapes of the first dam 331 and the second dam 332 are the same. In other embodiments, the shapes of the two dams may be different. The dam group 33 is an organic film layer, which can be the same layer as the pixel definition layer 322 and is prepared by using the same patterning process. The dam of the dam group 33 may be made of polyparaxyl or parylene materials, and the same mask as the pixel definition layer 322 is prepared through processes such as exposure and development. to make. It should be noted that a number of the dams of the dam group 33 is not limited to one, and may be two or more, which is not limited in the present application.

Figure 6C:
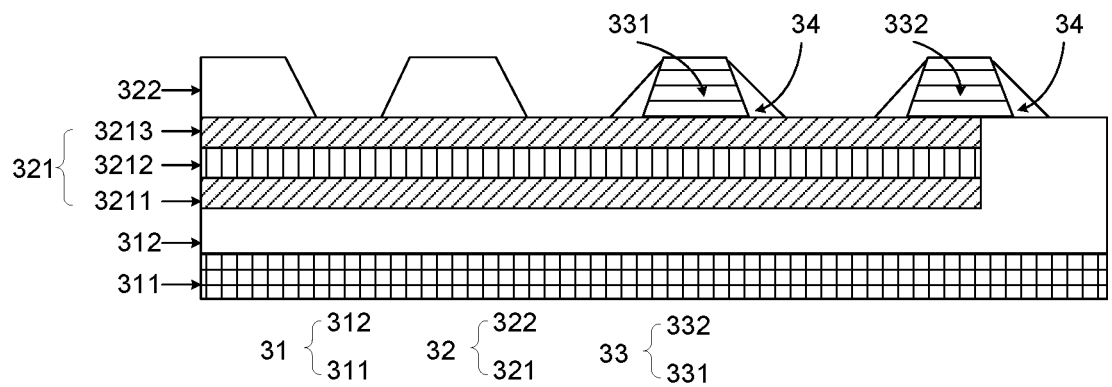

Step S53, forming a protective film near the dam, wherein the protective film covers at least a part of at least one side wall of the dam; the structure obtained after this step is shown in FIG. 6C. The protective film 34 may be prepared by an exposure and development method, a mask technology, or an imprint method. The protective film 34 may be made of epoxy resin, aluminum-based organic-inorganic composite film (alucone), or hexamethyldisiloxane (HMDSO).

In an embodiment, the protective films 34 cover two side walls of the first dam 331 and two side walls of the second dam 332, respectively. That is, the protective film is filled in a stress concentration area of the inorganic film layer at a corner of the corresponding dam. This can relieve stress concentration effect, thereby improving an issue of peeling phenomenon at the anode layer in the flexible display panel. A thickness of the protective film 34 is less than or equal to a thickness of the first dam 331 (the second dam 332 has the same shape as the first dam 331). In a front view, a cross-sectional view of the protective film 34 is an obtuse triangle, and a side wall of the protective film 34 away from the first dam 331 is a longest side of the obtuse triangle. A slope of a side wall of the protective film 34 away from the first dam 331 (that is, a side wall corresponding to a longest side of the obtuse triangle) is less than a slope of a sidewall of the first dam 331.

In another embodiment, the protective film completely covers the dam group 33. Specifically, the protective film covers both side walls and a top surface of the first dam 331 and covers both side walls and a top surface of the second dam 332. A thickness of the protective film covering the top surface of the corresponding dam is designed to be about 1 µm. That is, all exposed surfaces of the corresponding dam are covered with a protective film. This design can not only relieve stress concentration at the corner of the corresponding dam, but also relieve the stress at the top surface of the corner of the dam. This is more conducive to slowing down the stress effect of the inorganic film layer in the packaging structure, and effectively improving the issue of the peeling phenomenon at the anode layer in the flexible display panel.

Figure 6D:
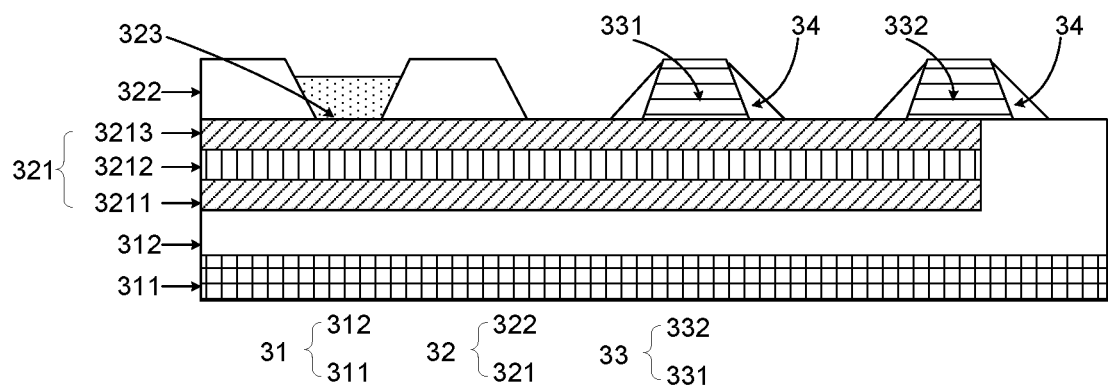

Step S54, forming a light emitting material functional layer of the light emitting device layer in an area defined by the pixel definition layer; the structure obtained after this step is shown in FIG. 6D. The light emitting material functional layer 323 includes an electron injection layer (EIL), an electron transport layer (ETL), a light emitting layer (EML), a hole injection layer (HIL), and a hole transport layer (HTL), which are formed on an area defined by the pixel definition layer 322. Light emitting material of the light emitting material functional layer 323 may be an OLED light emitting material. Accordingly, the flexible display panel is an OLED flexible display panel. It should be noted that, in other embodiments, the light emitting material of the light emitting material functional layer 323 may also be a quantum dot light emitting material, and a specific setting form of the light emitting material is not limited in the present application.

Step S55, forming a packaging structure on the light emitting device layer, wherein the packaging structure completely covers the light emitting device layer, the dam, the protective film, and the array substrate; the structure obtained after this step is shown in FIG. 3. The packaging structure 35 adopts an inorganic/organic film layer stack structure, which includes a first inorganic film layer 351, a first organic film layer 352, and a second inorganic film layer 353. It should be noted that the packaging structure 35 may also include a plurality of organic film layers. The plurality of organic film layers may be stacked between the first inorganic film layer 351 and the second inorganic film layer 353.

The first inorganic film layer 351 completely covers the light emitting device layer 32, the dam group 33, the protective film 34, and the array substrate 31. Its main function is to isolate water and oxygen and this prevents water or oxygen from invading the light emitting device layer (especially the light emitting material functional layer 323) and causing light emission to become dark. The first inorganic film layer 351 may be formed by using a chemical vapor deposition (CVD) process, a plasma enhanced chemical vapor deposition (PECVD) process, an atomic layer deposition (ALD) process, a physical vapor deposition (PVD) process, or sputtering coating process. It can be understood that the material used for the first inorganic film layer 351 is an inorganic material capable of increasing water and oxygen blocking performance of the device.

The first organic film layer 352 is deposited on the first inorganic film layer 351 and is located on a side of the dam group 33 away from an edge of the flexible display panel. It mainly plays a role of flattening a surface of the substrate and covering contaminated particles. The first organic film layer 352 may be prepared by using an inkjet printing (IJP) process. It can be understood that the material used for the first organic film layer 352 is a material for buffering stress of the device during bending and folding and covering the particulate pollutants. It can be understood that in some embodiments, there may be no contaminating particles.

The second inorganic film layer 353 completely covers the first organic film layer 352 and the first inorganic film layer 351, and its main function is to block water and oxygen. The second inorganic film layer 353 can also be prepared by using a chemical vapor deposition process, a plasma enhanced chemical vapor deposition process, an atomic layer deposition process, a physical vapor deposition process, or a sputtering coating process. It can be understood that the material used for the second inorganic film layer 353 is also an inorganic material that can increase the water and oxygen blocking performance of the device, which may be the same as the material used for the first inorganic film layer 351.

An embodiment of the present application fills the protective film in a stress concentration area of the inorganic film layer at the corner of the dam. On one hand, it can effectively slow down the slope of the sidewall of the dam and reduce stress concentration effect of the inorganic film layer in the upper packaging structure to a certain extent. On the other hand, when the protective film is subjected to stress, it can effectively relieve the stress and weaken or even eliminate stress effect of the packaging structure on the anode layer at the corner of the dam. By slowing down stress concentration at the corner of the dam from the above two aspects, issues of easy peeling of the anode layer at the dam can be effectively improved, and packaging yield of the flexible display panel can be improved.

It can be understood that for a person of ordinary skill in the art, equivalent replacements or changes can be made according to the technical solution of the present application and its inventive concept, and all these changes or replacements should fall within the protection scope of the claims attached to the present application.

What is claimed is:

1. A manufacturing method of a flexible display panel, comprising following steps:

forming an anode layer of a light emitting device layer on an array substrate;

forming a dam group and a pixel definition layer of the light emitting device layer on the anode layer, wherein the dam group comprises at least one dam disposed around an edge of the light emitting device layer;

forming a protective film near the at least one dam, the protective film covering at least a part of at least one side wall of the at least one dam, wherein a slope of a side wall of the protective film away from the at least one dam is less than a slope of a side wall of the at least one dam;

forming a light emitting material functional layer of the light emitting device layer in a region defined by the pixel definition layer; and forming a packaging structure on the light emitting device layer, and the packaging structure completely covering the light emitting device layer, the at least one dam, the protective film, and the array substrate.

2. The manufacturing method according to claim 1, wherein the anode layer has a sandwich structure of a first indium tin oxide (ITO) layer, an Ag layer, and a second ITO layer.

3. The manufacturing method according to claim 1, wherein the protective film is made of epoxy resin, aluminum-based organic-inorganic composite film, or hexamethyldisiloxane.

4. The manufacturing method according to claim 1, wherein a cross-sectional view of the protective film is an obtuse triangle in a front view, and a side wall of the protective film away from the at least one dam is a longest side of the obtuse triangle.

5. The manufacturing method according to claim 1, wherein in the step of forming the protective film near the at least one dam, the formed protective film completely covers the at least one dam.

6. The manufacturing method according to claim 1, wherein the dam group and the pixel definition layer are formed by a same patterning process.

7. The manufacturing method according to claim 1, wherein in the step of forming the protective film near the at least one dam, the protective film is further formed by an exposure and development method, a mask technology, or an imprint method.

* * * * *